United States Patent
Hueting et al.

(10) Patent No.: US 7,671,440 B2
(45) Date of Patent: Mar. 2, 2010

(54) LATERAL FIELD-EFFECT TRANSISTOR HAVING AN INSULATED TRENCH GATE ELECTRODE

(75) Inventors: Raymond J. E. Hueting, Hengelo (NL); Erwin A. Hijzen, Blanden (BE)

(73) Assignee: NXP B.V., Eindhoven (NL)

( * ) Notice: Subject to any disclaimer, the term of this patent is extended or adjusted under 35 U.S.C. 154(b) by 388 days.

(21) Appl. No.: 10/561,732

(22) PCT Filed: Jun. 10, 2004

(86) PCT No.: PCT/IB2004/001992

§ 371 (c)(1),
(2), (4) Date: Apr. 25, 2008

(87) PCT Pub. No.: WO2004/114411

PCT Pub. Date: Dec. 29, 2004

(65) Prior Publication Data

US 2008/0203473 A1    Aug. 28, 2008

(30) Foreign Application Priority Data

Jun. 20, 2003   (GB) ................... 0314390.6

(51) Int. Cl.
*H01L 29/76* (2006.01)
(52) U.S. Cl. .............. 257/492; 257/493; 257/330; 257/331; 257/332; 257/E21.585

(58) Field of Classification Search .......... 257/492, 257/493, 330–332, E21.585
See application file for complete search history.

(56) References Cited

U.S. PATENT DOCUMENTS

| 5,710,455 | A | * | 1/1998 | Bhatnagar et al. ........... 257/472 |
| 5,998,833 | A | | 12/1999 | Baliga |
| 6,777,746 | B2 | * | 8/2004 | Kitagawa et al. ............ 257/335 |
| 6,882,005 | B2 | * | 4/2005 | Disney ...................... 257/328 |
| 6,998,680 | B2 | * | 2/2006 | Kitamura et al. ............ 257/342 |
| 7,087,959 | B2 | * | 8/2006 | Shibib et al. ................ 257/335 |
| 2002/0185681 | A1 | * | 12/2002 | Nakano et al. .............. 257/336 |

FOREIGN PATENT DOCUMENTS

| EP | 0 735 589 | 10/1996 |
| WO | WO 00/68997 | 11/2000 |

\* cited by examiner

*Primary Examiner*—Eugene Lee

(57) ABSTRACT

A field-effect transistor having cells (18) each having a source region (22), source body region (26), drift region (20), drain body region (28) and drain region (24) arranged longitudinally, laterally alternating with structures to achieve a reduced surface field. In embodiments, the structures can include longitudinally spaced insulated gate trenches (35) defining a gate region (31) adjacent the source or drain region (22, 24) and a longitudinally extending potential plate region (33) adjacent the drift region (20). Alternatively, a separate potential plate region (33) or a longitudinally extending semi-insulating field plate (50) may be provided adjacent the drift region (20). The transistor is suitable for bi-directional switching.

15 Claims, 4 Drawing Sheets

LATERAL FIELD-EFFECT TRANSISTOR HAVING AN INSULATED TRENCH GATE ELECTRODE

The invention relates to trench field effect transistor structures, particularly lateral trench MOS structures for bi-directional switching.

For many applications it is attractive to have a switch which is capable of switching both negative and positive bias. For example, in portable apparatus powered by a rechargeable battery or a single cell, a power switch is used to connect the battery to the apparatus. The power switch needs to be able to block current passing in either direction through it.

One solution is to use two low-voltage trench Metal Oxide Semiconductor Field Effect Transistors (MOSFETs) in series. The drains or sources of the two MOSFETs are connected together in common drain or common source modes respectively. When both MOSFETs are switched on the pair conduct for charging. A disadvantage of this approach is that the use of two MOSFETs increases the resistance of the pair above the resistance of a single device.

A prior solution is the so-called ACCUFET shown schematically in FIG. 1. An N+ substrate 2 has an n-type epilayer 4 forming the body deposited on top. Trench gates 6 extend vertically into the epilayer 4, the gates 6 being insulated from the epilayer 4 by a thin gate insulator 8. N+ source diffusions 10 are provided adjacent the gates, and front 12 and back 14 contacts connect to the structure.

Unlike a conventional vertical trench MOS structure, the ACCUFET of FIG. 1 does not have a p-type body. This is done to provide two way blocking and to reduce the total on-resistance by omitting the channel resistance. However, there are a number of disadvantages. Firstly, there are significant constraints on the integral of the doping concentration laterally between the trench gates 6. The doping concentration profile must be such that when the gate voltage is negative the depletion layers of each of the trenches reach the centre to pinch off the electron current between source and drain. Secondly, the threshold voltage is low. Thirdly, the substrate forms an important part of the on-resistance.

There is thus a need for an improved semiconductor structure for bi-directional switching.

According to a first aspect of the invention, there is provided a semiconductor device having a first major surface, comprising: at least one cell having longitudinally spaced source and drain regions at the first major surface, a source body region at the end of the source region facing the drain region, a drain body region at the end of the drain region facing the source region and a drift region extending from the source body region to the drain body region; at least one pair of longitudinally spaced insulated gates, one of the pair being adjacent to the source body region and the other of the pair being adjacent to the drain body region, the gates extending longitudinally with longitudinal side walls, the insulated gates being formed in trenches having gate dielectric along the side and end walls and the base of the trench and a gate conductor within the gate dielectric; and plates adjacent to the drift region for controlling the drift region to carry current flowing between source and drain when the device is switched on and to support a voltage between source and drain when the device is switched off.

The structure is both symmetric and is capable of sustaining a high source-drain voltage when off using the drift region. The structure is a reduced surface field (RESURF) structure in which the doping in the drift region can be higher than it would otherwise be because of the plates. This reduces the specific on-resistance.

Preferably, the source and drain regions are of a first conductivity type and the source and drain body regions are of a second conductivity type opposite to the first conductivity type. In this way the structure can be a normally off structure. If the body regions were of the same conductivity type as the source and drain then the doping in the body region would need to be strictly controlled in order to achieve low leakage currents and suitable threshold currents in a like fashion to the doping requirements in vertical ACCUFETs described by T Syau et al, IEEE Transactions on Electron Devices, vol. 41, no 5, May 1994. By choosing opposite conductivity types, as in preferred embodiments of the invention, doping constraints are considerably relaxed.

Preferably, the drift region is of the first conductivity type (i.e. opposite to the body regions) with a dopant concentration less than $8\times10^{17}$ cm$^{-3}$, preferably in the range $5\times10^{16}$ to $5\times10^{17}$ cm$^{-3}$, most preferably for typical requirements $10^{17}$ to $2\times10^{17}$ cm$^{-3}$. The actual maximum depends on the doping profile in the drift region and the required breakdown voltage.

In embodiments, each of the pair of gates have a first part adjacent to the body region and a second part extending longitudinally adjacent to the drift region. The second part acts as a potential plate which induces the RESURF effect in the drift region so that the drift region is largely depleted for an increased doping concentration in the drift region when the device is switched off yet can still carry current when the device is on. This increased doping concentration reduces the specific on-resistance compared to a non-RESURF device.

The gate dielectric along the side wall of the gate may have a first thickness in the first part and a second higher thickness in the second part.

The device may include a plurality of cells spaced laterally across the first major surface of the substrate and a plurality of pairs of longitudinally spaced insulated gate trenches alternating with the cells. This increases the current handling capability of the device and reduces the on-resistance.

In embodiments the RESURF effect is achieved using semi-insulating field plates extending longitudinally from a source end adjacent to the source to a drain end adjacent to the drain laterally on either side of the or each cell.

The field plates may be connected using a source contact connected in common to the source or sources and to the source end of the field plate or plates and a drain contact connected in common to the drain or drains and the field plate or plates.

The gate trenches may extend from the first major surface to the substrate and the semi-insulating field plates may each extend from the first major surface into the substrate. The greater depth of the field plates allows a more even potential drop in the drift region and so can increase the breakdown voltage of the device.

Particular embodiments may include a plurality of cells and field plates alternating laterally across the first major surface. This increases the current handling capability of the device and reduces the on-resistance.

The source body region may extend under the source region and the drain body region under the drain region. This allows a source contact to be connected in common to the source and to the source body region and a drain contact to be connected in common to the drain and the drain body region.

A contact may be provided to contact the body. In embodiments in which the body is grown on a conductive substrate, this may be a rear contact.

For a better understanding of the invention, a prior art structure and embodiments of the invention will now be described with reference to the accompanying drawings, in which:

FIG. 8 shows a second section of the structure of FIG. 6. It should be noted that the Figures are schematic and not to scale. For ease of understanding, the same reference numerals are used for like or corresponding structures and elements.

Figure 1:
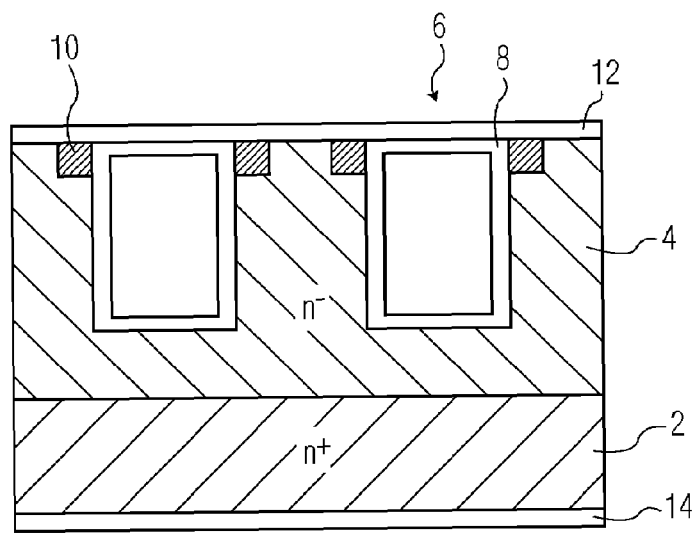
FIG. 1 shows a prior art ACCUFET structure.
Figure 2:
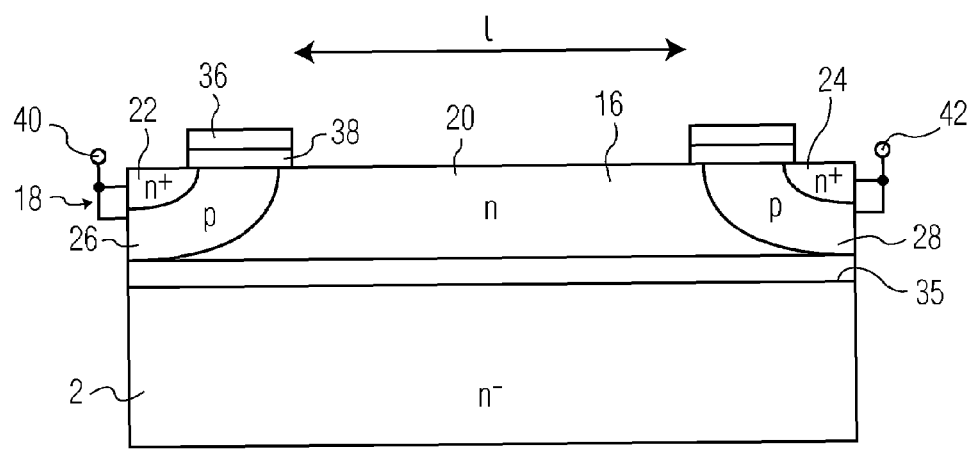
FIG. 2 shows a side cross-sectional view of a structure according to a first embodiment of the invention.
Figure 3:
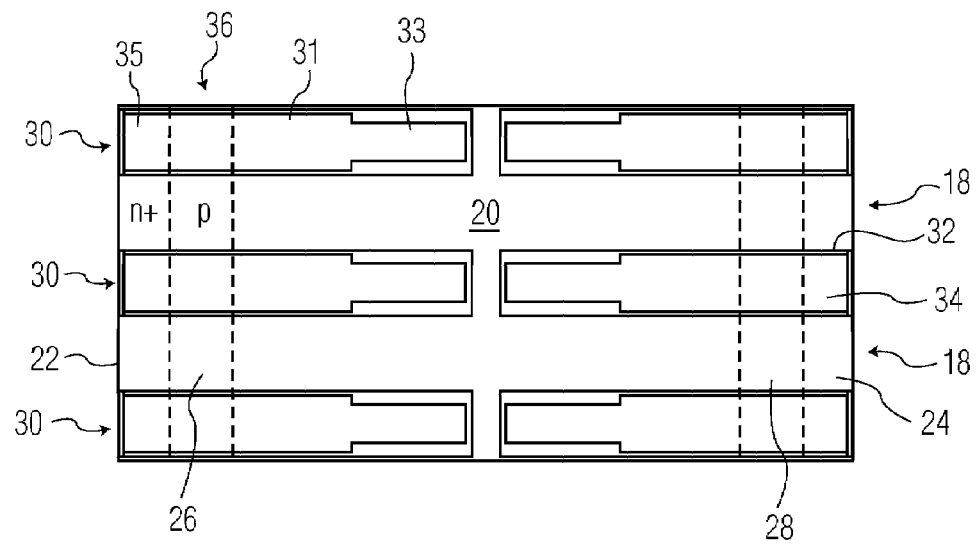
FIG. 3 shows a top view of the structure of FIG. 2.

Referring to FIGS. 2 and 3, a semi-insulating $n^-$ substrate 2 has an n type layer forming drift region 20 formed above it at the first major surface 16 of the semiconductor device. An individual cell 18 has source and drain regions 22, 24 formed as $n^+$ implantations spaced longitudinally apart with a p-type source body region 26 on the drain end of the source region 22 and a p-type drain body region 28 on the source end of the drain region 24. The drift region 20 extends from the source body region 26 to the drain body 28. The cell 18 thus has a source region 22, a drain region 24, and a central region having a source body region 26, the drift region 20 and the drain body region 28 linking source to drain to form a channel through the cell which passes electrons when the device is switched on.

In this preferred embodiment, the source and drain regions 22,24 are formed as shallow implantations of depth less than 0.3 μm, preferably in the range 0.15 to 0.25 μm.

Insulated gates are arranged in longitudinal pairs 30. Each longitudinal pair 30 includes two longitudinally spaced insulated trenches 35, one adjacent to the source body region 26 and one adjacent to the drain body region 28. The trenches 35 have an insulated gate dielectric 32 on the side walls, the end walls and the base of the trench 35 and contain a polysilicon gate material 34 within the trench 35. A gate region 31 is formed by the end of the insulated gate adjacent to the source or drain region 22,24 and in particular adjacent to the source or drain body region 26,28. The other end functions as a potential plate 33 adjacent to the drift region 20. The sidewalls of the gates have a thinner dielectric layer in the gate region 31 than in the potential plate region 33 at the other end adjacent to the drift region 20.

In the embodiment shown, each of the longitudinally spaced gates is in a separate trench, separated by part of the drift region 20. In alternative embodiments, the gates may be formed in a single trench.

The polysilicon of the gate material 34 may in alternative arrangements be replaced with metal or an intermetallic compound.

A source contact 40 is provided connected to the source region 22 and the source body region 26, and a drain contact 42 is provided connected to the drain region 24 and the drain body region 28.

The arrangement of FIGS. 2 and 3 shows a pair of cells 18 each extending longitudinally separated by a longitudinally arranged pair of gate trenches 30. In preferred embodiments, a larger number of cells 18 and gate trenches 30 are arranged laterally across the first major surface of the substrate, the cells 18 alternating with the gate trench pairs 30 so that each cell is arranged between a pair of gate trench pairs 30.

A pair of longitudinally spaced laterally extending gate connectors 36 extend over the gates, connecting together the laterally spaced gates. Isolation layer 38 is provided over the body regions 26, 28 to isolate the gate connectors 36 from the body regions. The isolation layer may be of any convenient insulator, such as oxide.

In use, the p-type source and drain body regions 26, 28 ensure that the transistor is normally off. In this state, the drift region 20 is depleted to ensure that a high voltage between source and drain can be sustained without breakdown. The length l of the drift region determines the voltage that can be withstood.

When a positive voltage is applied to the gate, a channel is created and electrons can pass through the body region and drift region. The parts of the gate adjacent to the drift region 20 act as a potential plate to ensure the drift region can conduct in this state. Importantly, the structure is bi-directional.

The device may be manufactured using any convenient semiconductor processing techniques, as will be familiar to the skilled person. For example, in a specific embodiment an n-type epilayer 20 is deposited on an $n^-$ substrate 2. The p-type source and drain body regions 26,28 are implanted, followed by the n+ type source and drain 22,24. Insulator 38 is deposited and patterned, followed by the gate connector 36 and the source and drain contacts 40,42. The skilled person will be aware of many alternative techniques, and these may be used also. For example, the n-layer 20 may be formed by implantation in the substrate.

Figure 4:
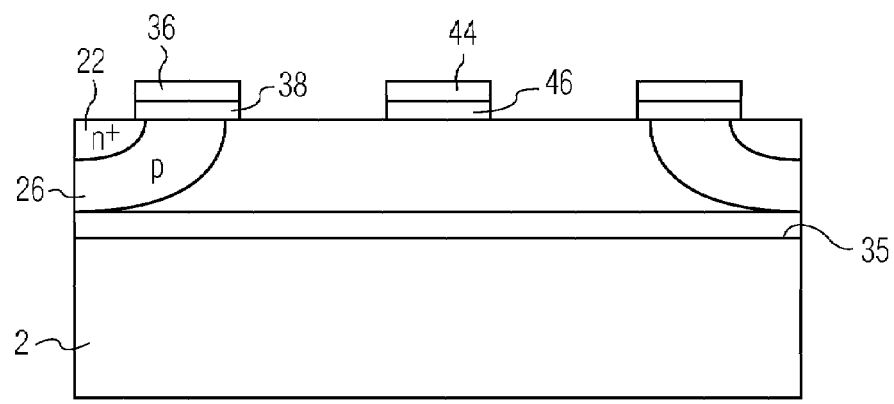
FIG. 4 shows a side cross-sectional view of a structure according to a second embodiment of the invention.
Figure 5:
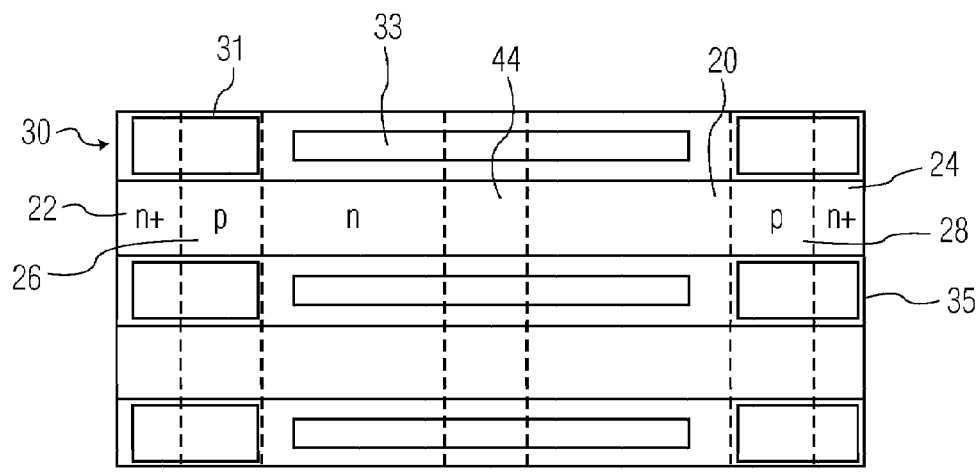
FIG. 5 shows a top view of the structure of FIG. 4.

An alternative arrangement is shown in FIGS. 4 and 5. In this arrangement a single potential plate region 33 extends between the pair 30 of gate regions 31. The potential plate region 33 in trench 35 is insulated from the gate region 31 by dielectric, and connected by a separate potential plate connector 44 extending laterally across the top surface. The potential plate connector crosses the drift region 20 and is insulated from the drift region by potential plate insulator 46.

This embodiment has the advantage that the length l of the drift region can be made smaller than the length l of the drift region in the first embodiment, which in turn reduces the on-resistance. The specific on-resistance in this arrangement can therefore be less that that achievable with the first embodiment.

In a further variation, the potential plate 33 can be joined at each end to the adjacent gate region.

Figure 6:
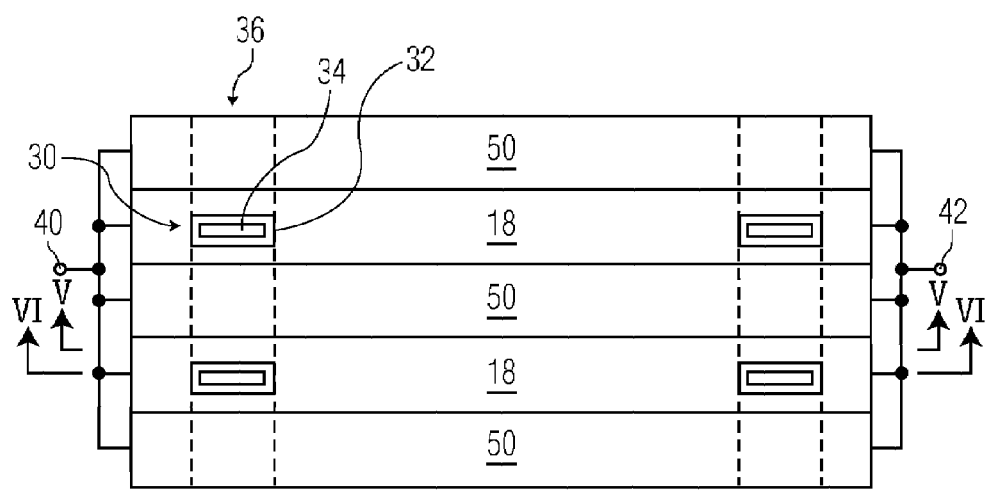
FIG. 6 shows a top view of a structure according to a third embodiment of the invention.
Figure 7:
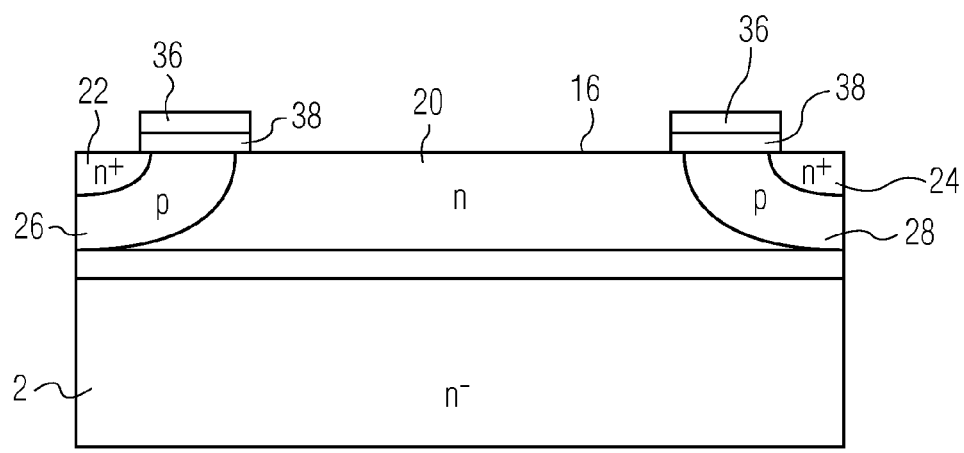
FIG. 7 shows a first section of the structure of FIG. 6.
Figure 8:
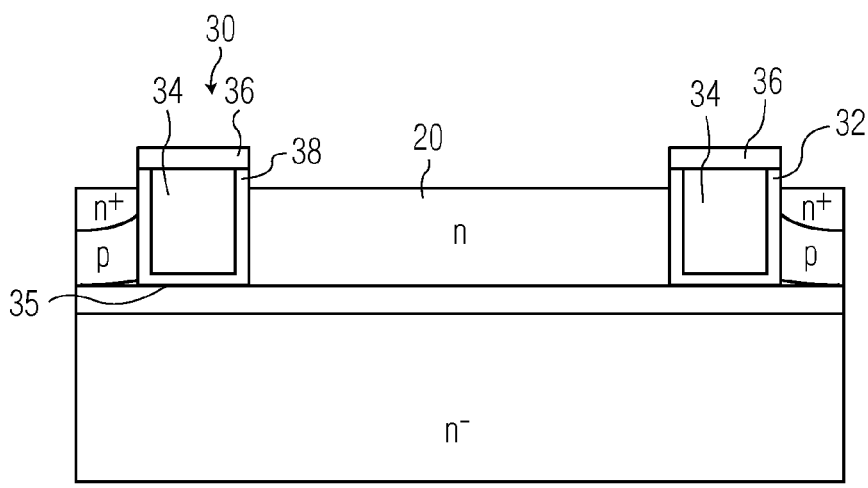

In an alternative embodiment, illustrated in FIGS. 6 to 8, the potential plate of the earlier embodiments is replaced with a field plate. FIG. 7 shows a longitudinal section which passes through the cell of the channel away from the gate, and FIG. 8 shows a longitudinal section through the gates. These sections are indicated in the top view of FIG. 6 by V-V and VI-VI, respectively.

As in the arrangement of FIGS. 2 and 3, an $n^-$ substrate 2 has an n type drift region 20 formed on it, with a cell formed of longitudinally arranged $n^+$ source 22, p source body 26, n drift 20, p drain body 28 and $n^+$ drain 24 regions.

Unlike the arrangement of FIGS. 2 and 3, the cells are separated by longitudinally extending semi-insulating field plates 50 formed in trenches. Thus, laterally across the device field plate trenches 50 alternate with cells 18. The ends of the field plate 50 are connected to the source and drain contacts 40, 42 in parallel with the sources and drains 22, 24 and the source and drain body regions 26,28.

In this arrangement, a pair 30 of gates is arranged within each cell at the source body region 26 on the sidewalls, base and end walls of the trench and the drain body region 28. A trench 35 has a gate dielectric 32 on the sidewalls, ends and base to insulate the gate. The trench 35 is filled with conductive gate material 34. As in the arrangement of FIGS. 2 and 3, gate contacts 36 extend laterally above the first major surface connecting to the gates 34, separated from the semi-insulating field plates 50 and the source body and drain body regions 26, 28 by an insulator 38.

For manufacturing convenience, the doping in the drift region may be constant. In alternative arrangements, the drift region 20 may have a graded doping profile with the lowest doping adjacent to the body regions 26,28 and a higher doping in the middle of the drift region 20. Such graded doping profiles can improve performance by increasing the possible doping. For example, for a linearly graded doping profile in the drift region in 25V devices, the maximum doping concentration is about $5 \times 10^{17}$ cm$^{-3}$. For a 60V device, $2 \times 10^{17}$ cm$^{-3}$ represents the maximum. However, for devices with a uniform doping in the drift region, either 25V or 60V, the maximum doping is about $1.5 \times 10^{17}$ cm$^{-3}$.

In use, when the device is switched off the voltage between source and drain contacts 40,42 causes an even potential gradient along the semi-insulating field plates 50. This ensures that the voltage in the cells is dropped reasonably evenly along the length of the cell, particularly along the drift region 20, so that a high voltage can be sustained across the device. The device can be switched on by applying a positive voltage to the gates, as above.

It will be appreciated that the conductivity types indicated in the embodiments described herein may be reversed.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A semiconductor device having a first major surface comprising: at least one cell having longitudinally spaced source and drain regions at the first major surface, a source body region at the end of the source region facing the drain region, a drain body region at the end of the drain region facing the source region and a drift region extending from the source body region to the drain body region;

at least one pair of longitudinally spaced insulated gates, one of the pair being adjacent to the source body region and the other of the pair being adjacent to the drain body region, the gates extending longitudinally with longitudinal side walls, the insulated gates being formed in trenches having gate dielectric along the side and end walls and the base of the trench and a gate conductor within the gate dielectric; and plates adjacent to the drift region for controlling the drift region to carry current flowing between source and drain when the device is switched on and to support a voltage between source and drain when the device is switched off.

2. A semiconductor device according to claim 1 wherein the source and drain regions are of a first conductivity type and the source and drain body regions are of a second conductivity type opposite to the first conductivity type.

3. A semiconductor device according to claim 2 wherein the drift region is of the first conductivity type with a dopant concentration in the range of $5 \times 10^{16}$ cm$^{-3}$ to $5 \times 10^{17}$ cm$^{-3}$.

4. A semiconductor device according to claim 1 wherein the plates are insulated conductive potential plates adjacent to the drift region.

5. A semiconductor device according to claim 4 wherein an insulated conductive potential plate extends from the each of the pair of gates longitudinally towards the other of the pair of gates adjacent to the drift region, each conductive potential plate being in electrical contact with the gate from which it extends.

6. A semiconductor device according to claim 5 wherein the dielectric along the side wall of the potential plates has a greater thickness than the dielectric along the side wall of the gates.

7. A semiconductor device according to claim 4 comprising at least one longitudinally extending potential plate between the longitudinally spaced gates and insulated from the longitudinally spaced gates.

8. A semiconductor device according to claim 1 comprising a plurality of cells spaced laterally across the first major surface of the substrate alternating with pairs of longitudinally spaced insulated gates.

9. A semiconductor device according to claim 1 wherein the plates comprise resistive field plates extending longitudinally on either side of each cell from a source end adjacent to the source to a drain end adjacent to the drain.

10. A semiconductor device according to claim 9 further comprising a source contact connected in common to the source region or regions and to the source end of the field plate or plates and a drain contact connected in common to the drain region or regions and drain end the field plate or plates.

11. A semiconductor device according to claim 9 wherein the gate trenches extend from the first major surface to the substrate and the semi-insulating field plates each extend from the first major surface to the substrate.

12. A semiconductor device according to claim 9 including a plurality of cells and field plates alternating laterally across the first major surface.

13. A semiconductor device according to claim 1 wherein the gates are arranged within the lateral bounds of each cell.

14. A semiconductor device according to claim 1 wherein the source body region extends under the source region and the drain body region extends under the drain region.

15. A semiconductor device according to claim 1 comprising a source contact connected in common to the source and to the source body region and a drain contact connected in common to the drain and the drain body region.

* * * * *